United States Patent
Ausschnitt et al.

(10) Patent No.: US 6,417,929 B1
(45) Date of Patent: Jul. 9, 2002

(54) OPTICAL MEASUREMENT OF LITHOGRAPHIC POWER BIAS OF MINIMUM FEATURES

(75) Inventors: Christopher P. Ausschnitt, Brookfield, CT (US); Christopher J. Progler, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 09/716,868

(22) Filed: Nov. 20, 2000

Related U.S. Application Data

(62) Division of application No. 09/330,656, filed on Jun. 11, 1999, now Pat. No. 6,183,919.

(51) Int. Cl.[7] .............................................. G01B 11/02
(52) U.S. Cl. ........................ 356/635; 356/634; 356/635
(58) Field of Search .................................. 356/635, 625, 356/634; 430/22, 30

(56) References Cited

U.S. PATENT DOCUMENTS

| | | | |
|---|---|---|---|
| 5,629,772 A | 5/1997 | Ausschnitt | 356/372 |
| 6,063,531 A | 5/2000 | Sigh et al. | 430/30 |

OTHER PUBLICATIONS

"Alighment errors from resist coating topography" by Bobroff et al. J. Vac. Sci. Tech. B6 (1) Jan./Feb. 1988 pp. 403–408.

*Primary Examiner*—Frank G. Font
*Assistant Examiner*—Amanda Merlino
(74) *Attorney, Agent, or Firm*—Ratner & Prestia; Tiffany L. Townsend, Esq.

(57) ABSTRACT

A method for optically measuring lithographic process bias of a minimum feature formed by a lithographic process. The method comprises creating on a substrate an array of elements from which a darkfield optical image is generated and detected, electronic information corresponding to the image is generated and processed, and the difference between the created length versus the nominal length of the elements is calculated to determine lithographic process bias. The darkfield optical image may be a double-lobe optical image, and signal processing may comprise creating a normalized intensity profile to overcome film-thickness dependencies, to which one or more noise-rejecting, edge-detection methods is or are applied to calculate the created length of the elements. A method for using double-lobe darkfield imaging for general edge detection is also disclosed.

10 Claims, 4 Drawing Sheets

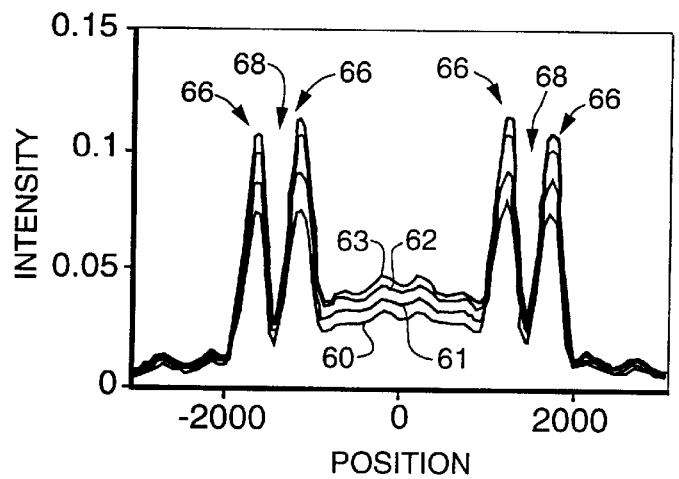
Fig. 6A
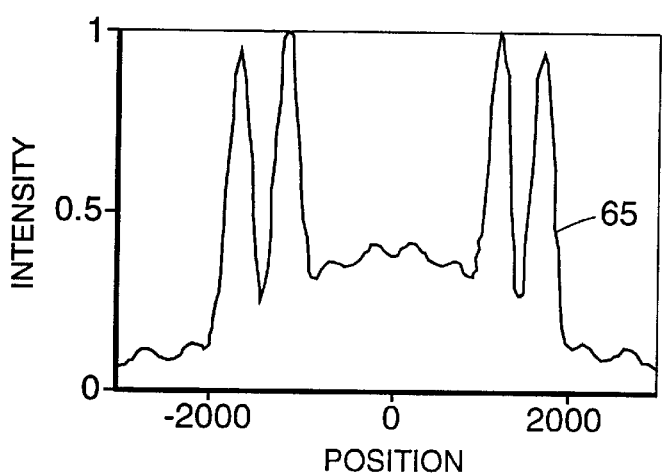
Fig. 6B
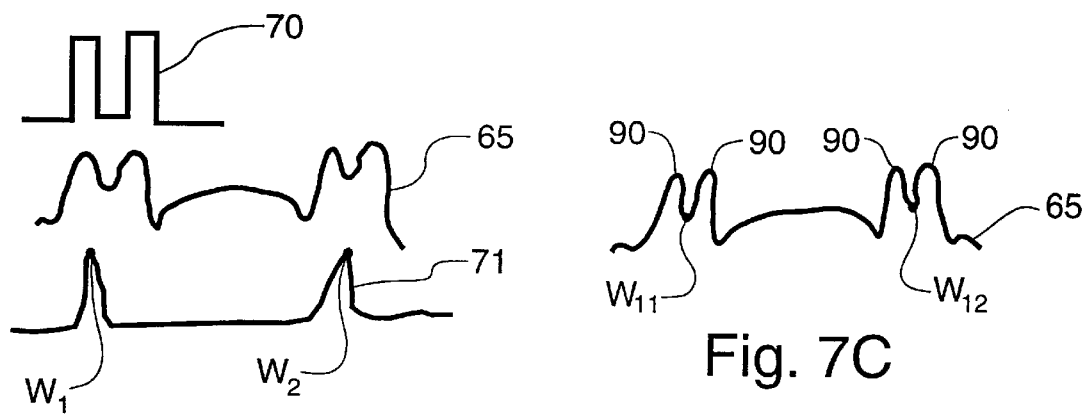
Fig. 7A
Fig. 7C
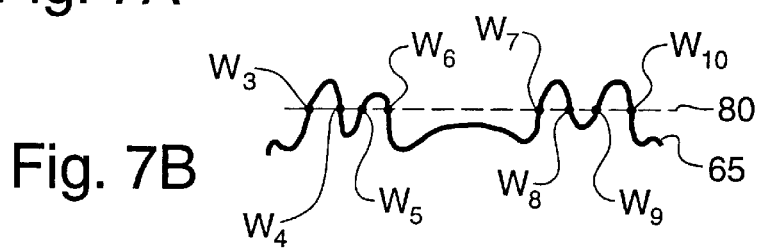
Fig. 7B

OPTICAL MEASUREMENT OF LITHOGRAPHIC POWER BIAS OF MINIMUM FEATURES

This application is a divisional of U.S. patent application Ser. No. 09/330,656, filed on Jun. 11, 1999, now U.S. Pat. No. 6,183,819.

TECHNICAL FIELD

The present invention relates generally to manufacturing processes requiring lithography and, more specifically, to monitoring of lithographic processes used in microelectronics manufacturing.

BACKGROUND OF THE INVENTION

Lithography is used in microelectronics manufacturing, particularly in the manufacture of semiconductors, to transfer an integrated circuit pattern to a photoresist film on a substrate. Radiation, such as light, is spatially modulated through a pattern on a mask or reticle to form an aerial image that exposes the radiation-sensitive photoresist film according to the mask pattern. The photoresist is developed, or the pattern may be transferred to the substrate by an etching step, followed by removal of the photoresist.

Because the exposure and focus of the aerial image relative to the photoresist may vary due to variations in substrate reflectivity, film thickness, or topography, it is necessary to continually monitor the transferred patterns to verify that the dimensions of the patterns are within an acceptable range. The importance of such monitoring increases as the size of the features being produced decreases. The difficulty in monitoring such features also increases, however, as the size of the features decreases. This difficulty is exacerbated for features having a size on the order of one micron or less. This is because the preferred method of using a scanning electron microscope (SEM) for performing inspections tends to be relatively slow in operation and difficult to automate for features of a smaller size. The use of optical tools permits faster and more readily automated operations to be implemented, but such optical techniques are inadequate to resolve features of a smaller size, particularly those having dimensions of less than about one micron.

To overcome this problem, U.S. Pat. No. 5,629,772 (issued to Ausschnitt, assigned to the assignee of the present invention, and incorporated by reference) discloses an optical metrology method used in the manufacture of microelectronics. Essentially, referring now to FIGS. 1 and 2, this method comprises using a lithographic process to create a pattern 28 comprising an array of elements 44 on a substrate 45, each element 44 in the array having a length "L" and width "W," with spaces 46 between adjacent elements 44 also having a width W. Substrate 45 may have other layers on its surface, such as layers 45' and 45" as shown in FIG. 2, which may typically comprise silicon dioxide and silicon nitride, respectively.

Typically, width W of elements 44 and spaces 46 between adjacent elements 44 corresponds to the minimum feature dimension for the lithographic process used to create the elements 44. In contrast, length L is larger than the minimum feature. The known method comprises measuring the larger length L of elements 44 as created by the lithographic process, calculating the change in length L of the elements 44 from the nominal length of the elements 44, and calculating the lithographic process bias of the minimum feature from the change in length of the array elements 44. The term "bias" is used to describe the difference between the dimensions of a feature as actually created by the lithographic process and the corresponding nominal dimensions of the pattern 28 desired to be created.

One potential problem with monitoring minimum features in this way is the interaction of sub-layer films with the estimate of the minimum feature size. As the thickness and optical characteristics of the underlying films change, a bias in the minimum feature width is often caused by interference effects between the light reflected from the various regions within and outside the minimum feature structure. Such a bias can be substantially reduced by eliminating the zero order or specular component in the image formation process, such as by using darkfield imaging methods.

A number of darkfield methods have been proposed that provide zero order rejection in the context of optical alignment of wafer structures and for detection of minimum features using optical imaging and polarization rejection. See, generally, Bobroff et al., "Alignment Errors from Resist Coating Topography," J. Vac. Sci. Tech., Vol. B6 (1) (January/February 1988), and co-pending U.S. patent application Ser. No. 09/159,240 (Progler et al.). Methods for higher-resolution measurement of minimum feature size while accounting for sub-layer film bias, however, as well as edge-detection methods that may be implemented on existing brightfield microscopy equipment with minimum modifications, are still desired.

SUMMARY OF THE INVENTION

The present invention provides a method for optically measuring lithographic process bias of a minimum feature formed by a lithographic process. The method comprises creating on a substrate an array of elements having spaces between the elements. Each element in the array has a nominal length and a nominal width, and each space has a nominal width. The nominal width of each element and of each space corresponds to the minimum feature. The nominal length is larger than the minimum feature.

The method further comprises measuring the length of the elements in the array as created by the lithographic process. The length is measured by generating a darkfield optical image of the array of elements, detecting the darkfield optical image with an optical detector, generating electronic information corresponding to the optical image, and processing the electronic information to determine the created length of the elements in the array. The method still further comprises calculating the difference between the created length versus the nominal length and determining lithographic process bias of the minimum feature from that difference in length.

Generation of the darkfield image may further comprise generating a double-lobe darkfield optical image, in which case the method comprises generating a corresponding double-lobe intensity profile. The electronic information corresponding to the intensity profile may be processed and evaluated to calculate the created element length using a matched filter, application of a threshold slice, or definition of redundant measures of feature width as explained below.

The method of the present invention may be implemented on a system comprising a pattern for creating an array of elements to be formed by a lithographic process, an array of elements actually formed by the lithographic process, a darkfield imaging system, an optical detector, and a signal processor. The pattern comprises an array of elements having spaces between the elements, each element having a nominal length and a nominal width, and each space having a nominal width. The nominal width of each element and of each space corresponds to the minimum feature of the lithographic process. The nominal length is larger than the minimum feature.

The array of elements is actually created by the lithographic process on a substrate, each element with an actual length and an actual width and each space with an actual width. The darkfield imaging system is adapted to create a darkfield image of the array of elements. The optical detector is adapted to detect that darkfield image and produce corresponding electronic information from that image. The signal processor is adapted to receive the electronic information and process it to determine the lithographic process bias corresponding to the difference between the actual width and the nominal width as calculated based on a difference between the actual length and the nominal length.

The signal processor may further comprise a program storage device readable by a machine, tangibly embodying a program of instructions executable by the machine to perform the method steps for processing electronic information corresponding to the darkfield image to determine the lithographic process bias. The tangibly embodied, machine-executable method steps comprise receiving electronic information corresponding to the darkfield image from the optical detector, processing the electronic information to determine the created length of the elements, calculating a difference between the created length and the nominal length, and determining lithographic process bias of the minimum feature from the difference between the created length and the nominal length.

The present invention also comprises a method of using double-lobe darkfield imaging to detect one or more edge locations in any recorded pattern on a substrate. The method comprises generating a double-lobe darkfield optical image from the recorded pattern, detecting the double-lobe darkfield optical image with an optical detector, generating electronic information corresponding to the detected optical image, and processing the electronic information to determine one or more edge locations. The method may further comprise generating a double-lobe intensity profile and processing that intensity profile to determine the one or more edge locations. The method may still further comprise measuring a distance between two edge locations using the double-lobe intensity profile.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 6A is an exemplary graph illustrating a plurality of thickness-dependent image intensity profiles;

FIG. 6B is an exemplary graph illustrating a normalized image intensity profile; and FIGS. 7A, 7B, and 7C are exemplary graphs illustrating various edge detection schemes.

DETAILED DESCRIPTION OF INVENTION

Figure 3A:
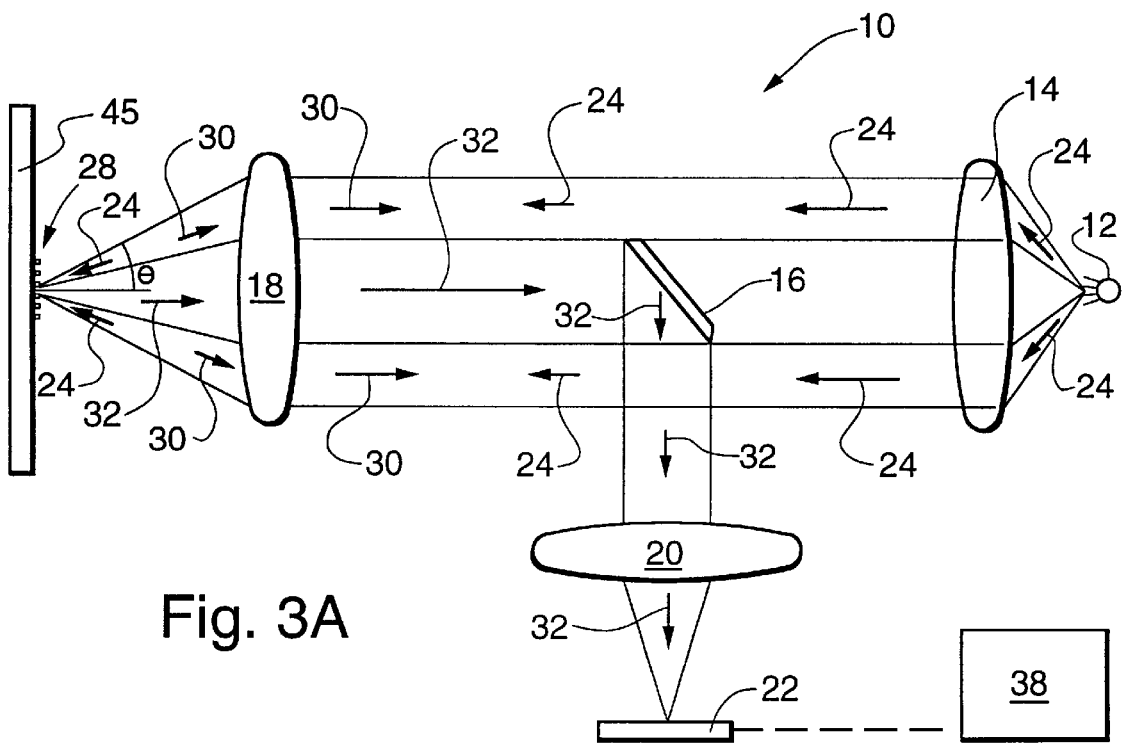
FIG. 3A is a schematic illustration of an exemplary system of the present invention for creating a darkfield image.

Referring now to the drawing, in which like reference numerals refer to like elements throughout, FIG. 3A is a schematic illustration of an exemplary system 10 for creating a darkfield configuration optical image of a recorded pattern. System 10 comprises an illumination source 12, an input or illumination lens 14, a mirror 16, an objective lens 18, a detector lens 20, an optical detector 22, and a signal processor 38. Although described in terms of "light" or "illumination," illumination source 12 comprises any radiation source that emits radiation inside or outside of the human visible spectrum.

Illumination source 12 generates an annular illumination beam 24 directed through illumination lens 14 and passing through objective lens 18. Objective lens 18 focuses beam 24 upon recorded pattern 28 on substrate 45. The beam 24 is reflected and scattered by recorded pattern 28, forming a specular or reflected component 30 and a scattered component 32.

Specular component 30 returns in the same annular path as illumination beam 24; scattered component 32 returns through a path in the unilluminated center of the annular illumination beam 24. Specular component 30 and scattered component 32 both pass back through objective lens 18, after which scattered component 32 reflects off mirror 16, through detector lens 20, and onto optical detector 22. In contrast, reflected component 30, having an annular shape, continues around mirror 16. Optical detector 22 may be a diode array or charge-coupled device (CCD) array detector, such as are known in the art. Optical detector 22 generates electronic information corresponding to the detected image, which it passes to signal processor 38 for further processing.

Figure 3B:
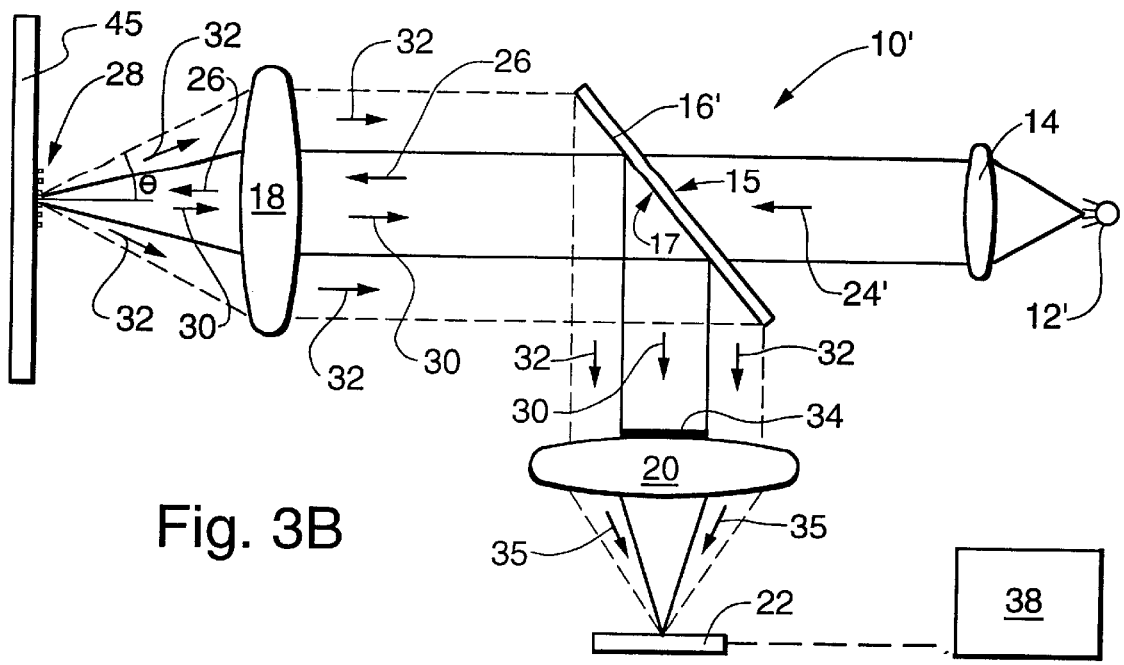
FIG. 3B is a schematic illustration of a system of the present invention for creating a double-lobe darkfield image.

Referring now to FIG. 3B, there is shown a schematic illustration of an exemplary system 10' for creating a double-lobe darkfield configuration optical image of a recorded pattern. System 10' comprises illumination source 12', an input or illumination lens 14, a beam splitter 16', an objective lens 18, a detector lens 20, an optical detector 22, and a signal processor 38. Illumination source 12 generates an illumination beam 24' directed through illumination lens 14 to the front side 15 of beam splitter 16'.

Fraction 26 of illumination beam 24' passes through beam splitter 16' onto and through objective lens 18, and impinges upon recorded pattern 28 on substrate 45. Fraction 26 is reflected and scattered by recorded pattern 28, forming a specular or reflected component 30 and a scattered component 32. Specular component 30 and scattered component 32 pass back through objective lens 18 and reflect off the back side 17 of beam splitter 16' to detector lens 20. Detector lens 20 has an opaque blocking aperture 34 that blocks specular component 30 so that only scattered component 32 passes through to optical detector 22 and is converted to electronic information to be transmitted to signal processor 38.

FIG. 3B shows the light path with specular component 30 bordered by a solid line and scattered component 32 between the solid line and dotted line. The light that forms the detected image is thus contained in an annulus of light 35 with no center angles present, because of the presence of blocking aperture 34.

Opaque blocking aperture 34 is typically positioned on a plane conjugate to the aperture stop of objective lens 18, as shown in FIG. 3B. Opaque blocking aperture 34 may have a diameter that is approximately half the numerical aperture of objective lens 18. Thus, the scattered light forms an image through the outer halt of the numerical aperture of the objective lens 18. The diameter of opaque blocking aperture 34 may be further optimized relative to the numerical aperture of objective lens 18 for the given pattern pitch of the recorded pattern 28 being studied. For instance, using simulation or experimentation, the diameter of the blocking aperture 34 could be varied for a selected pattern 28 while observing or modeling the signal-to-noise ratio or the pattern symmetry of the detected image. A blocking aperture diameter that maximizes signal-to-noise ratio or minimizes signal asymmetry can then be chosen.

Figure 4:
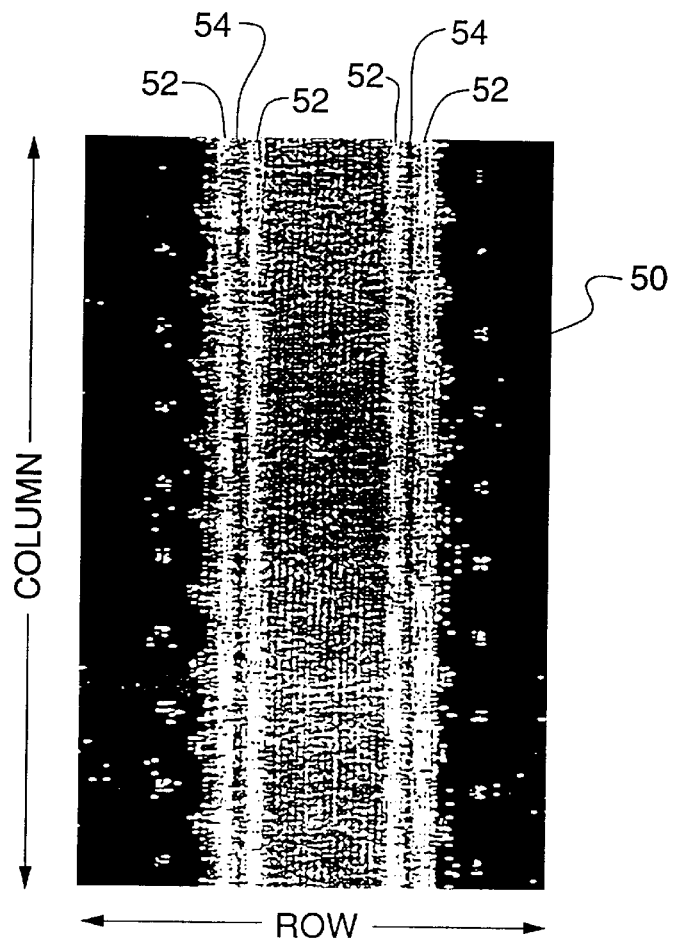
FIG. 4 is a representation of a double-lobe darkfield optical image.

Illumination of pattern 28 using system 10' as shown in FIG. 3B produces a double-lobe darkfield image 50 as shown in FIG. 4. Image 50 comprises two sets of double lobes 52, each set of lobes having a dark fringe 54 between the lobes 52. These lobes 52 correspond to the edges of the elements 44 of pattern 28. Illumination of pattern 28 using system 10 as shown in FIG. 3A produces a single lobe darkfield image (not shown) which is similar to image 50 but has only a single bright lobe on each side of the image, each lobe corresponding to an edge of elements 44 of pattern 28.

In creating a darkfield image, any optical device that can accept scattered component 32 and reject specular component 30 may be substituted for the configurations presented in this patent document. For instance, in an alternate double-lobe darkfield embodiment (not shown), a mirror having a hole in the center may replace beam splitter 16' shown in FIG. 3B. Illumination beam 24' and specular component 30 pass through the center hole in such a configuration whereas annularly shaped scattered component 32 is reflected to optical detector 22.

Figure 1:
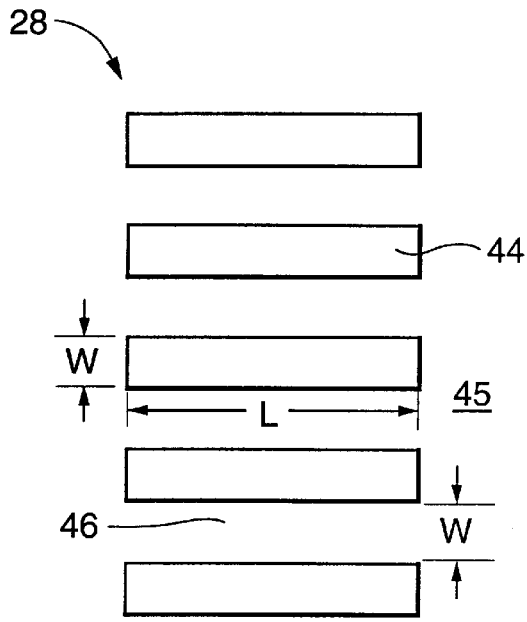
FIG. 1 is a plan view of a pattern of the prior art used in optical metrology.
Figure 2:
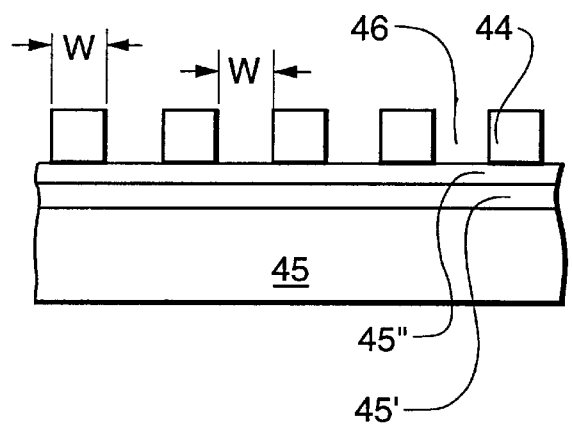
FIG. 2 is a cross-sectional view of the pattern of the prior art used in optical metrology illustrated in FIG. 1.
Figure 5:
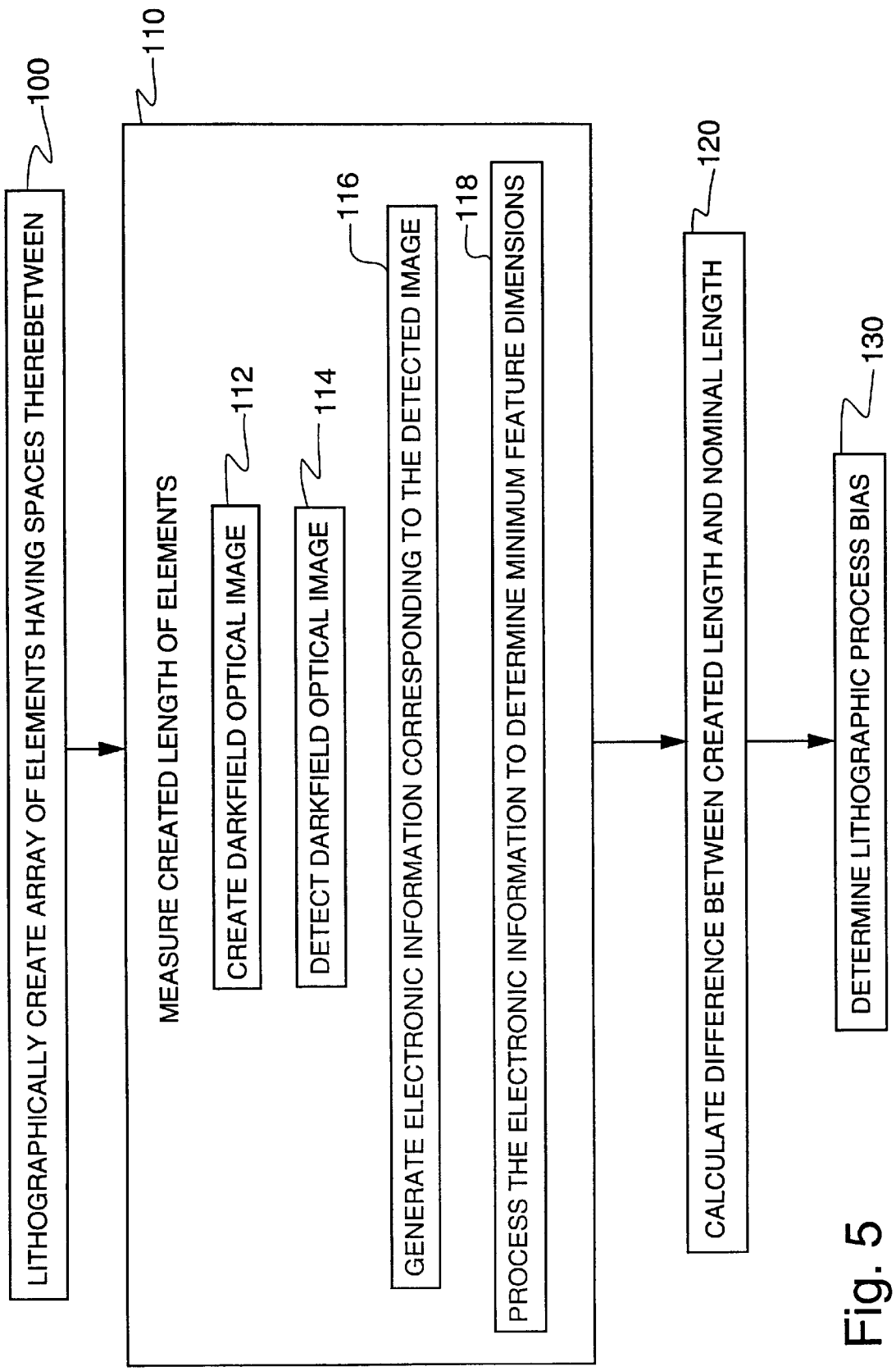
FIG. 5 is a flowchart depicting an exemplary method of the present invention.

The apparatus illustrated in FIGS. 3A and 3B may be used to optically measure the lithographic process bias of a minimum feature formed by a lithographic process. The method using the apparatus is depicted in the flowchart of FIG. 5. The method comprises at step 100 creating an array of elements on a substrate by a lithographic process. As shown in FIGS. 1 and 2, elements 44 have spaces 46 between them. Each element 44 in the array has a nominal length and a nominal width and each space 46 has a nominal width corresponding to the length and width of the pattern 28 desired to be formed. The nominal width of each element 44 and of each space 46 corresponds to the minimum feature. The nominal length is larger than the minimum feature. The created width W and created length L of elements 44 and spaces 46 in pattern 28 will equal the nominal widths and nominal lengths if there is no lithographic process bias.

Next, at step 110, the process further comprises measuring the created length L of elements 44. In accordance with the present invention, measurement step 110 further comprises, at substep 112, generating a darkfield optical image of the array of elements 44. Next, at substep 114, a darkfield optical image, such as image 50 as shown in FIG. 4, is detected with an optical detector. At substep 116, electronic information corresponding to the image is generated by the optical detector and transmitted to the signal processor. Then the electronic information is processed at substep 118, such as by creating an intensity profile 65 as shown in FIG. 6B, and created length L of elements 44 is determined. Next, at step 120, the difference between the length L of created elements 44 and the nominal length is calculated. Finally, at step 130, the lithographic process bias of the minimum feature is determined from the difference between the created length and the nominal length.

During processing of the electronic information corresponding to the detected optical image, such as image 50 as shown in FIG. 4, the electronic information may be integrated along the length of the detector array to form an electronic image cross section. For instance, assuming that image 50 represents light impinging on an optical detector array, the array comprises pixels aligned in rows and columns, each pixel being a discrete radiation detector that generates a digital signal when radiation is detected. The percentage of all detectors in a column that detect radiation may be plotted in the form of an intensity profile as shown in FIG. 6A, in which the x-axis represents the column position (in pixels) from a center column.

Any signal processor known in the art, such as a computer, may be used to process the optical images received by the optical detector into electronic information. The signal processor may use a program storage device, such as a computer program, readable by a machine, such as a computer, tangibly embodying a program of instructions executable by the machine or computer to perform the signal processing method steps described above. Thus, the optical detector detects the image and converts the detected image to electronic information as is well known in the art, and that electronic information is transmitted to the signal processor. The signal processor processes the electronic information, such as, by first generating an intensity profile like the profile shown in FIG. 6B.

For illustrative purposes, double-lobe intensity profiles 60, 61, 62, and 63 corresponding to image 50 are shown in FIG. 6A and are described with regard to processing. A single lobe intensity profile (not shown) resulting from the single lobe image (not shown) corresponding to image 50 may be similarly processed. A single lobe intensity profile resembles double-lobe intensity profiles 60, 61, 62, 63 except that only a single peak is present on each side, approximately where valley 68 is located between adjacent peaks 66 in double-lobe intensity profiles 60, 61, 62, 63 shown in FIG. 6A.

A plurality of thickness-dependent image intensity profiles 60, 61, 62, 63 are shown in FIG. 6A for a plurality of substrate film thicknesses. Variation in film thickness is a normal part of semiconductor processing. FIG. 6A illustrates that, despite the variation in intensity related to the film thickness, each signal has the same profile. Thus, there is no thickness dependency with respect to the location of the peaks and valleys. In fact, each profile 60, 61, 62, 63 may be converted to a normalized double-lobe intensity profile 65, as shown in FIG. 6B, by dividing each thickness-dependent image intensity profile 60, 61, 62, 63 by a maximum image intensity value for each corresponding film thickness.

Using normalized double-lobe intensity profile 65 as an example, the edge position locations may be calculated using any one of a number of noise-rejecting, edge detection methods or filters. One such filter, illustrated in FIG. 7A, involves convolving intensity profile 65 with a matched filter 70. Matched filter 70 is designed so that it rejects extraneous scattering from grainy films and other artifacts, while locking onto the double-lobe pattern from each edge.

Matched filter 70 in this context is thus simply a replica of the expected intensity profile for each edge of the minimum feature image.

Similarly, a single-lobe intensity profile (not shown) may be processed with a matching filter (not shown) having only a single peak. Double-peak matched filter 70 used with double-lobe intensity profile 65 provides an advantage over the single lobe profile and filter, however, in that other extraneous signals (noise, imperfections in the surface, and the like) may produce a single-peak image not eliminated by the filter. The precise double-peak profile is not likely to be replicated by such extraneous signals, and thus will be rejected by double-peak matched filter 70.

Although FIG. 7A shows matched filter 70 as a two-level (on/off) matched filter, the matched filter 70 can have any number of levels. A correlation operation is performed between the matched filter and the intensity signal. The maximum value of the correlated output 71 is used to determine the location of each edge position $w_1$ and $w_2$ on the position axis.

The numbers on the position (abscissa or "x") axis as shown in FIGS. 6A and 6B represent the pixel count on the optical detector array. The pixel count can be converted to a physical dimension given the known pixel size for the optical detector. Thus, the distance between the edge locations may be calculated as $w_2-w_1$. The position axis is not shown in FIGS. 7A, 7B, or 7C.

Another edge-detection method, application of a threshold slice, is illustrated in FIG. 7B. Threshold slice is a standard edge-detection method in which the location of the edge is found at some intersection point or points of a threshold line 80 with intensity profile 65. In the standard case, a single estimate of the edge location is made at each threshold slice level. The double-lobe image of the present invention allows generation of a four-point average of the edge locations; a single-lobe image enables only a two-point average. As shown in FIG. 7B, threshold line 80 intersects intensity profile 65 at points $W_3$, $W_4$, $W_5$, $W_6$, $W_7$, $W_8$, $w_9$, and $w_{10}$. Thus the edge positions may be expressed as:

$$edge_1=(w_3+w_4+w_5+w_6)/4$$

$$edge_2=(w_7+w_8+w_9+w_{10})/4$$

and the distance between lobes may then be calculated as $edge_2-edge_1$. The single-lobe intensity profile may be similarly processed by summing the two points generated for each edge and dividing by two.

An edge-detection method comprising definition of redundant measures of feature width may also be implemented using points $w_3$, $w_4$, $w_5$, $w_6$, $w_7$, $w_8$, $w_9$, and $w_{10}$ illustrated in FIG. 7B. The shape of the double-lobe image permits redundant measures of the feature width to be developed from a single intensity trace. For instance, the following exemplary widths may be calculated:

$$width_1=w_7-w_3$$

$$width_2=w_{10}-w_6$$

$$width_3=(w_9+w_8)/2-(w_5+w_4)/2$$

$$width_4=(w_{10}+w_7)/2-(w_6+w_3)/2$$

Given these multiple estimates of width, calculated from the intensity trace, the information can be used to cull or eliminate bad data and provide additional confidence regarding the width measurement. One advantage of creating a double-lobe rather than only a single-lobe intensity profile is that more redundant measurements are available because each edge has four points corresponding to a threshold slice rather than only two.

Yet another edge-detection method comprises identification of and measurement between the dark fringes 54 located between lobes 52, as shown in FIG. 4. As illustrated in FIG. 7C, double-lobe intensity profile 65 has corresponding lobe intensities 90, and the minimum intensities $w_{11}$ and $w_{12}$ between lobe intensities 90 correspond to the dark fringes 54. The locations of $w_{11}$ and $w_{12}$, and thus the corresponding calculated width $w_{12}-w_{11}$, is independent of threshold slice level, signal contrast, or basic signal shape. This method is not applicable to single-lobe intensity profiles, and thus is unique to the double-lobe method.

In addition to providing more redundancies of measurement and noise-rejecting advantages as described above, the double-lobe system is preferred because it may be easily implemented on existing metrology equipment. For instance, the mere addition of a blocking aperture to an existing brightfield system produces the double-lobe darkfield system as described above. Such a blocking aperture may be adapted for easy addition and removal without permanently modifying existing equipment or adding complexity to that equipment.

Moreover, double-lobe darkfield systems generally allow operation over the full resolution range of the microscope objective lens. For instance, as shown in FIGS. 3A and 3B, the numerical aperture (NA) of objective lens 18 is equal to the sine of the angle of convergence θ. A higher NA (larger θ) enables smaller resolution. As shown in FIG. 3A, a standard darkfield system must set aside a portion of the NA for annular illumination beam 24, thus leaving only the portion of the NA corresponding to the unilluminated annulus for resolution of the reflected and scattered image. Thus, for a given objective lens NA, the double-lobe darkfield method provides higher resolution; the entire NA may be dedicated to resolution of the reflected or specular components 30 and scattered components 32, as shown in FIG. 3B.

Stated another way, to achieve the same resolution (the same NA dedicated to the specular and scattered components), the objective lens in a standard darkfield system 10 as shown in FIG. 3A must provide a larger overall angle θ than for the double-lobe darkfield system 10' as shown in FIG. 3B. Because construction tolerances are proportionately more strict for larger convergence angles, the use of double-lobe darkfield imaging therefore also allows for relaxed large-angle construction tolerances as compared to standard darkfield imaging.

In addition to use with the specific pattern geometries as described above, double-lobe optical imaging may also be used for general detection of one or more edge locations of any recorded pattern on a substrate. Such method essentially comprises steps 112 through 118 of the flowchart shown in FIG. 5. Thus, a double-lobe darkfield optical image, such as image 50 in FIG. 4, is generated from a recorded pattern on a substrate, such as shown and described with respect to the specific pattern 28 in FIG. 3B. The double-lobe darkfield optical image is detected with an optical detector, such as optical detector 22 as shown in FIG. 3B.

Electronic information is generated corresponding to the detected optical image, and the electronic information is processed, such as by creating an intensity profile 65 as shown in FIG. 6B. The position of one or more edge locations, such as $w_1$ and $w_2$ of FIG. 7A, may then be determined. Such edge location information may be used to measure the distance between the two edge locations, such as for determining minimum feature dimensions as described above. The techniques described above, including correlation with a matched filter, application of a threshold slice, definition of redundant measures of feature width, and identification of and measurement between the dark lines of the double-lobe optical image as represented by the double-lobe intensity profile, may all be used.

Although illustrated and described with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A system for optically measuring lithographic process bias of a minimum feature formed by a lithographic process, the system comprising:

a pattern adapted to create an array of elements by the lithographic process on a substrate, the elements having spaces therebetween, each element in the array having a nominal length and a nominal width and each space having a nominal width, the nominal width of each element and of each space corresponding to the minimum feature and the nominal length being larger than the minimum feature;

an actual array of elements created by the lithographic process on the substrate, each element having an actual length and an actual width and each space having an actual width;

a darkfield imaging system adapted to create a darkfield image of the actual array of elements;

an optical detector for detecting the darkfield image and for producing corresponding electronic information therefrom; and a signal processor for processing the electronic information to determine the lithographic process bias corresponding to a difference between the actual width and the nominal width as calculated based on a difference between the actual length and the nominal length.

2. The system of claim 1 wherein the darkfield imaging system is a double-lobe darkfield imaging system.

3. The system of claim 2 wherein the double-lobe darkfield imaging system further comprises:

an illumination source producing an illumination beam;

an input lens;

a beam splitter having a front side and a back side;

an objective lens having an aperture stop and a numerical aperture; and a detector lens having an opaque blocking aperture;

wherein the illumination beam from the illumination source passes through the input lens to the beam splitter front side, a fraction of the illumination beam passes through the beam splitter onto and through the objective lens and impinges upon the pattern, the fraction is reflected and scattered by the pattern into the reflected component and the scattered component, the reflected and scattered components pass back through the objective lens and reflect off the beam splitter back side to the detector lens, the reflected component is blocked by the detector lens opaque blocking aperture, and the scattered component passes through to the optical detector.

4. The system of claim 3 wherein the opaque blocking aperture is positioned on a plane conjugate to the aperture stop of the objective lens.

5. The system of claim 4 wherein the opaque blocking aperture has a diameter that is approximately half the objective lens numerical aperture.

6. The system of claim 5 wherein the opaque blocking aperture has a diameter and the pattern has a pitch, and in which the blocking aperture diameter is optimized relative to the objective lens numerical aperture according to the pattern pitch.

7. The system of claim 1 wherein the signal processor further comprises a program storage device readable by a machine, tangibly embodying a program of instructions executable by the machine to perform the method steps for processing electronic information corresponding to the darkfield image to determine the lithographic process bias, the method steps comprising:

a) receiving electronic information corresponding to the darkfield image from the optical detector;

b) processing the electronic information to determine the created length of the elements;

c) calculating a difference between the created length and the nominal length; and d) determining lithographic process bias of the minimum feature from the difference between the created length and the nominal length.

8. The system of claim 7 in which the tangibly embodied, machine-executable steps further comprise in step (b) generating an intensity profile and processing the intensity profile to determine edge position locations and corresponding distances between the edge position locations that correspond to the created length of the elements.

9. The system of claim 8 wherein the darkfield imaging system is a double-lobe darkfield imaging system, and in which the tangibly embodied, machine-executable steps further comprise in step (b) generating a double-lobe intensity profile for further processing thereof.

10. The system of claim 9 in which the tangibly embodied, machine-executable steps further comprise determining the edge position locations on the normalized intensity profile in step (b) by correlation with a detection scheme selected from the group consisting of correlation with a matched filter, application of a threshold slice, and definition of redundant measures of feature width.

* * * * *